United States Patent [19]
Kim

[11] Patent Number: 5,982,704
[45] Date of Patent: Nov. 9, 1999

[54] ROW ADDRESS STROBE SIGNAL INPUT BUFFER

[75] Inventor: Jeong-Tae Kim, Seoul, Rep. of Korea

[73] Assignee: Samsung Electronics, Co., Ltd., Suwon, Rep. of Korea

[21] Appl. No.: 09/004,995

[22] Filed: Jan. 9, 1998

[30] Foreign Application Priority Data

Jan. 10, 1997 [KR] Rep. of Korea .......................... 97/484

[51] Int. Cl.$^6$ ...................................................... G11C 8/00
[52] U.S. Cl. ...................................... 365/230.08; 365/233
[58] Field of Search ................................ 365/230.08, 233

[56] References Cited

U.S. PATENT DOCUMENTS 5,515,331   5/1996   Kim ........................................ 365/233
5,521,878   5/1996   Ohtani et al. ....................... 365/230.08

*Primary Examiner*—David Nelms
*Assistant Examiner*—M. Tran
*Attorney, Agent, or Firm*—Marger Johnson & McCollom, P.C.

[57] ABSTRACT

A row address strobe signal input buffer and method for converting an external input row address strobe signal to an internal signal and protecting the internal signal from background noise in the circuit. In the preferred embodiment the invention level-shifts the row address strobe signal to an internal signal of CMOS signal level. It then latches the internal signal to its current state and opens a transmission gate cutting off the internal signal from the external row address strobe signal. This prevents glitches in the internal signal due to noise in the circuit introduced due to the external row address strobe signal being of a TTL level. The gate remains open for a delayed period of time, the delay determined by a delay circuit or by the length of a pulse from a pulse generator. After the delay period, the gate is closed, restoring the signal connection between the external row address signal and the internal signal.

17 Claims, 5 Drawing Sheets

ROW ADDRESS STROBE SIGNAL INPUT BUFFER

BACKGROUND OF THE INVENTION

1. Field of the Invention

The present invention relates to a row address strobe signal input buffer of a semiconductor memory device and, more particularly, to a row address strobe signal input buffer for receiving a row address strobe signal of a TTL (Transistor-Transistor Logic) level and generating an internal signal of a CMOS (Complementary Metal Oxide Semiconductor) level.

2. Description of the Related Art

In a dynamic random access memory (DRAM), a row address strobe signal input buffer is a circuit for converting a row address strobe signal $\overline{RAS}$ which is an externally applied chip enable signal, into a chip internal signal. The row address strobe signal $\overline{RAS}$ is externally supplied to the row address strobe signal input buffer at a TTL level and converted into the internal signal of a CMOS level, enabling the DRAM. That is, when the row address strobe signal $\overline{RAS}$ is changed from logic "HIGH" to logic "LOW", it drives the row address strobe signal input buffer which generates a signal that activates the DRAM. However, since the row address strobe signal $\overline{RAS}$ is not a signal of the CMOS level, the output state of the row address strobe signal input buffer may fluctuate due to power noise generated within the DRAM. In other words, the output of the row address strobe signal input buffer may be affected by various power noise sources within a chip, such as bit line sensing noise, data output noise, etc. The affected output of the row address strobe signal input buffer leads to a glitch in the signal level of the internal signal.

FIG. 1 is a circuit diagram of a conventional row address strobe signal input buffer. An inverter I1 receives a power-up reset signal VCCH. A PMOS transistor T1 supplies a voltage of logic "HIGH" to the source of a PMOS transistor T2 in response to an output signal of the inverter I1. The PMOS transistor T2 and an NMOS transistor T3 having the channels serially connected between the drain of the transistor T1 and a ground voltage terminal $\overline{RAS}$al constitute an inverter and generate an inverted output of the row address strobe signal. An NMOS transistor T4 has the gate connected to the output signal of the inverter I1 and has the channel connected between a node N1 and the ground voltage terminal. Inverters I2 and I3 are serially connected between the node N1 and an internal signal PR. The transistors T1–T4 are a circuit having the construction of a NOR gate.

In operation, the power-up reset signal VCCH is used for cutting off the operation of internal circuits of a semiconductor memory device until VCCH is raised to a predetermined level, about 2 V for instance. When VCCH is changed from logic "LOW" to logic "HIGH" its activated state, the row address strobe signal input buffer is initialized. Once the circuit is initialized the internal signal PR in response to the row address strobe signal $\overline{RAS}$. In the initialized state, if the row address strobe signal $\overline{RAS}$ is changed from logic "HIGH" to logic "LOW," its activated state, the internal signal PR is changed from logic "LOW" to logic "HIGH," its enabled state. However, as shown in FIG. 2, a timing chart of the signals indicated in FIG. 1, during the activated interval of the row address strobe signal $\overline{RAS}$, if the row address strobe signal $\overline{RAS}$ is sensed as logic "HIGH" by the power noise within the chip, such as the bit line sensing noise, data output noise, etc., the node N1 is inverted from logic "HIGH" to logic "LOW," and the internal signal PR is changed from logic "HIGH" to logic "LOW," its disabled state. This sequence of events causes a glitch in the internal signal.

SUMMARY OF THE INVENTION

It is an object of the present invention to provide a row address strobe signal input buffer for preventing an internal row address signal from being disabled due to power noise.

It is another object of the present invention to provide a row address strobe signal input buffer which is not influenced by ground voltage noise generated by bit line sensing noise or data output noise.

A row address strobe signal input buffer embodying the present invention includes: a pad for receiving a row address strobe signal; a level-shifting buffer connected to the pad, for receiving the row address strobe signal and generating a level-shifted internal signal; a pulse generator connected to an output terminal of the level-shifting buffer, for generating a pulse delayed for a predetermined time in response to the internal signal; a switching circuit connected to the output terminal of the level-shifting buffer, for cutting off a signal path between the row address strobe signal and the internal signal; and a latch circuit connected to the output terminal of the level-shiting buffer, for maintaining a level of the internal signal in response to the pulse.

The above objects and advantages of the present invention will become apparent from the following detailed description when read in connection with the accompanying drawings, in which like reference numerals or symbols designate like elements.

DETAILED DESCRIPTION OF THE PREFERRED EMBODIMENT

Figure 1:
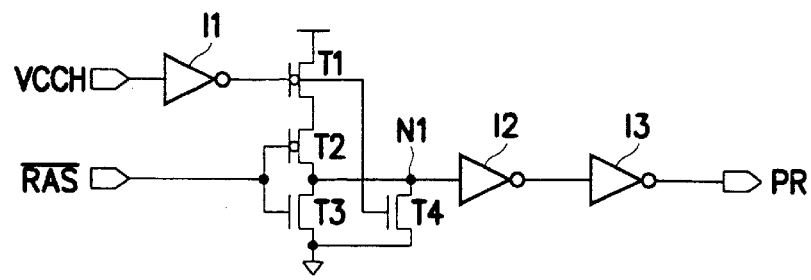
FIG. 1 is a circuit diagram of a conventional row address strobe signal input buffer.
Figure 2:
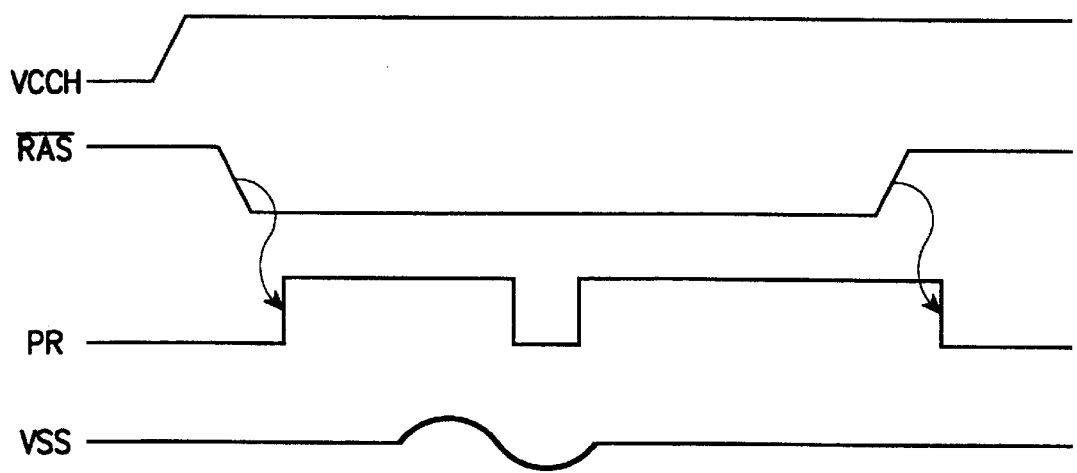
FIG. 2 is a timing chart of each portion of FIG. 1.
Figure 3:
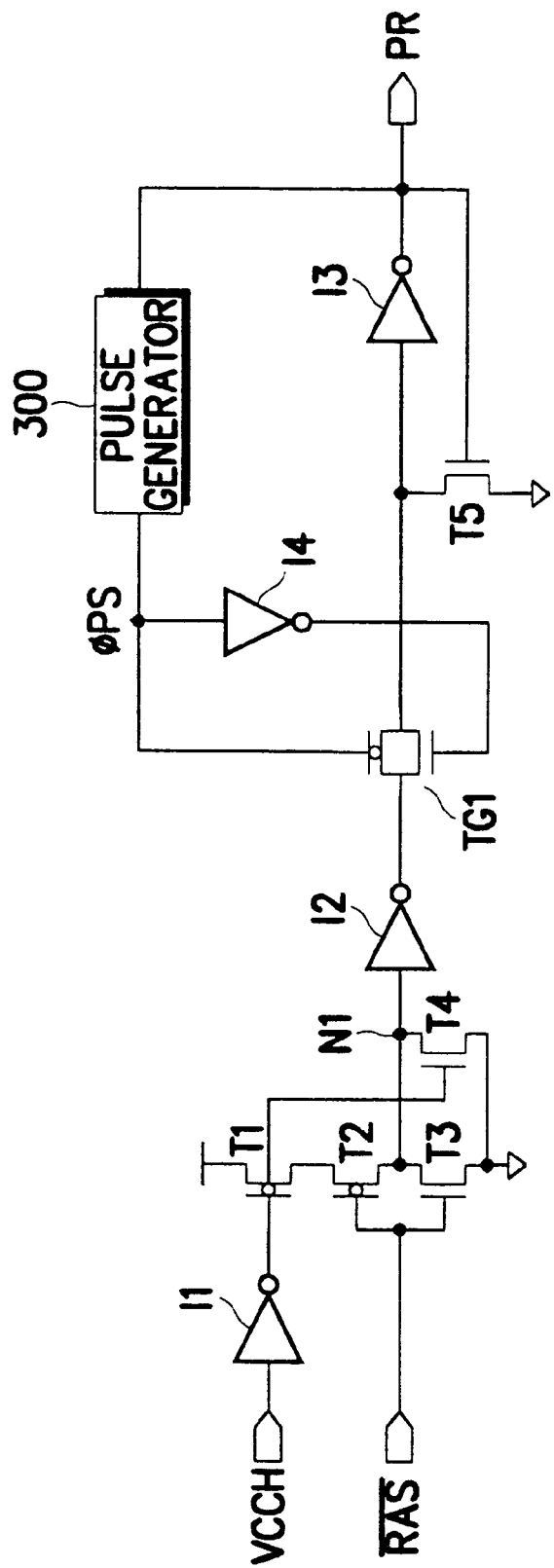
FIG. 3 is a circuit diagram of a row address strobe signal input buffer according to one preferred embodiment of the present invention.

Referring to FIG. 3, a row address strobe signal input buffer according to one preferred embodiment of the present invention, further includes a pulse generator 300, a transistor T5 for carrying out a latch operation and a transmission gate TG1 for performing a switching operation, in addition to the row address strobe signal input buffer of FIG. 1. The pulse generator 300 generates a pulse φPS which is activated for a predetermined time in response to the internal signal PR. The transmission gate TG1 which is driven in response to the pulse φPS is connected between inverters I2 and I3. The transmission gate TG1 consists of a PMOS transistor controlled by the pulse φPS and an NMOS transistor controlled by the pulse φPS inverted by an inverter I4. The transistor T5 has the channel connected between an input terminal of the inverter I3 and a ground voltage terminal and has the gate connected to the internal signal PR.

Figure 4:
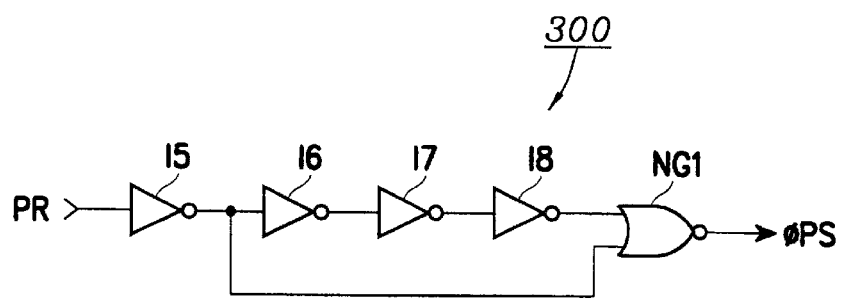
FIG. 4 is a detailed circuit of a pulse generator shown in FIG. 3.

FIG. 4 is a detailed circuit diagram of the pulse generator 300 shown in FIG. 3. The pulse generator 300 includes a NOR gate NG1 having a first input terminal for receiving the internal signal PR through an inverter I5 and having a second input terminal for receiving the internal signal PR through serially connected inverters I5–I8.

Figure 5:
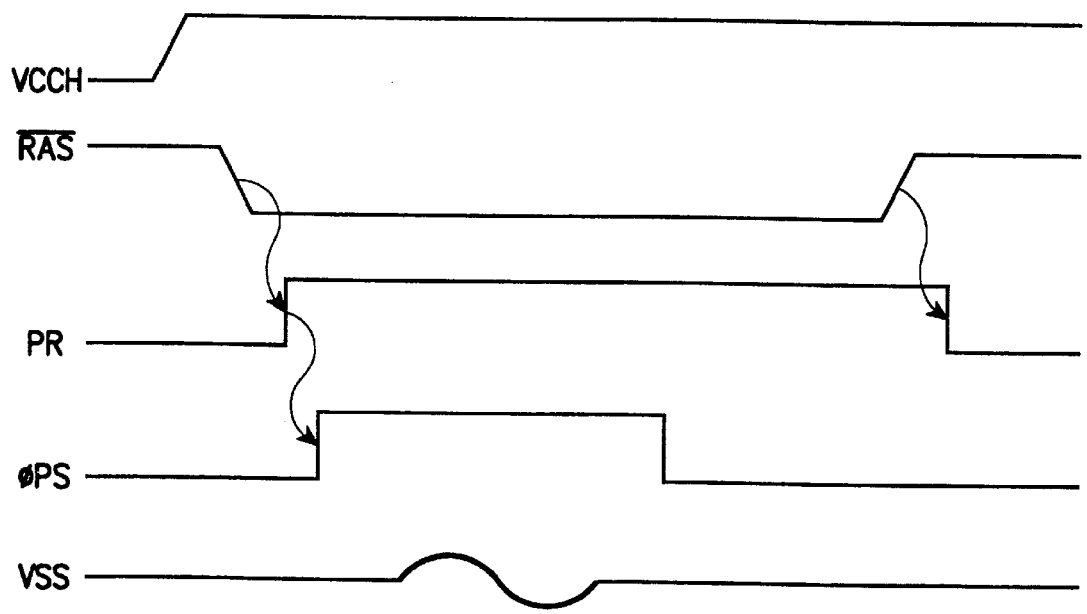
FIG. 5 is a timing chart of each portion of FIG. 3.

FIG. 5 is a timing chart of each portion of FIG. 3.

In operation, when the power-up reset signal VCCH is changed from logic "LOW" to logic "HIGH," its activated state, the row address strobe signal input buffer is initialized. In this initialized state, if the row address strobe signal fheightRAS is changed from logic "HIGH" to logic "LOW," its activated state, the internal signal PR is changed from logic "LOW" to logic "HIGH," its enabled state. The internal signal PR is then supplied to the pulse generator 300, and the output signal φPS of the pulse generator 300 is inverted by the invertor I4. The transmission gate TG1 which had been turned on is turned off by the inverted signal φPS. The internal signal PR is maintained at a logic "HIGH" its activated state by the transistor T5. The pulse φPS is disabled after the end of a ground voltage noise interval and before a transition of the row address strobe signal fheightRAS from logic "LOW" to logic "HIGH", turning back on the transmission gate TG1. With the transmission gate TG1 now turned on, a new row address strobe signal fheightRAS can be received.

As described above, during the ground voltage noise interval, since a signal path between the row address strobe signal fheightRAS and the internal signal PR is cut off, the row address strobe signal input buffer is not influenced by the noise. That is, a glitch in an input level of the row address strobe signal fheightRAS can be prevented.

Other variations of this embodiment of the invention are possible. The transistor T5, use for latching the internal signal PR, may be replaced with other elements. For example, the internal signal PR may be latched by a transistor having the channel connected between the internal signal PR and a power voltage terminal and having the gate connected to the output of the pulse generator 300. Moreover, the buffer may be achieved without using the power-up reset signal VCCH. That is, the present invention may be practiced without using the inverter I1 and the transistors T1 and T4.

Figure 6:
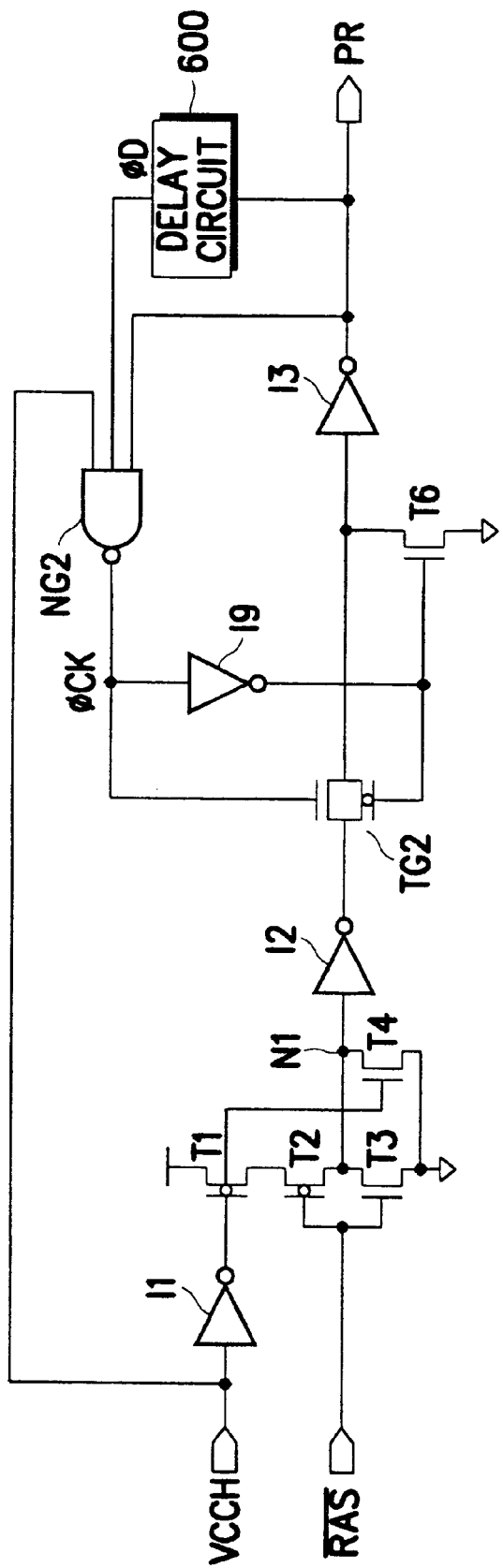
FIG. 6 is a circuit diagram of a row address strobe signal input buffer according to another preferred embodiment of the present invention.

FIG. 6 shows another embodiment of a row address strobe signal input buffer. The row address strobe signal input buffer of FIG. 6 includes a NAND gate NG2 having three inputs, one for the power-up reset signal VCCH, one for the internal signal PR and one for the internal signal PR delayed through a delay circuit 600. The buffer of FIG. 6 also includes a transmission gate TG2 for performing a switching operation in response to the output signal φCK of the NAND gate NG2, and a transistor T6 for performing a latch operation, in addition to the row address strobe signal input buffer of FIG. 1.

Figure 7:
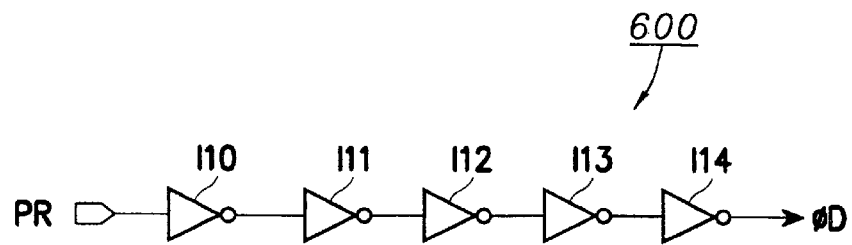
FIG. 7 is a detailed circuit diagram of a delay circuit shown in FIG. 6.
Figure 8:
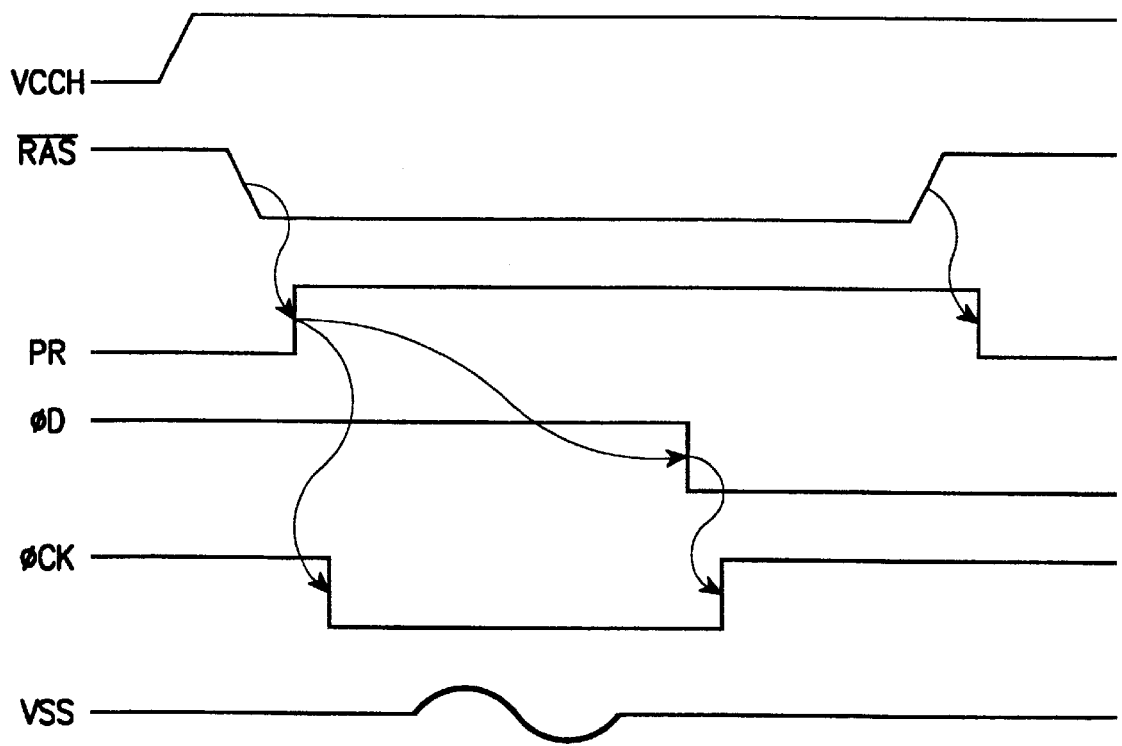
FIG. 8 is a timing chart of each portion of FIG. 6.

The delay circuit 600 as indicated in FIG. 7, includes, an odd-number inverters I10–I14 which are driven in response to the internal signal PR generated from the interior of the chip. The number of inverters is not restricted to the number shown in FIG. 7 and it is possible to adjust their number as may be necessary to acheive the timing shown in the diagram timing of FIG. 8. That is, the inverters are for cutting off the row address strobe signal fheightRAS for a specific period of time where the ground voltage noise is present.

In operation, if the power-up reset signal VCCH is changed from logic "LOW" to logic "HIGH," its activated state, the row address strobe signal input buffer is initialized. In this initialized state, if the row address strobe signal fheightRAS is changed from logic "HIGH" to logic "LOW," its activated state, the internal signal PR is changed from logic "LOW" to logic "HIGH" its enabled state. The internal signal PR is supplied to the NAND gate NG2, and the output signal φCK of the NAND gate NG2 is inverted by the invertor I9. The transmission gate TG2 which had been turned on is turned off by the inverted signal φCK. The internal signal PR can be maintained at a logic "HIGH" level of the activated state by the transistor T6 which is turned on by the inverted signal φCK. The pulse φCK is enabled after the end of the ground voltage noise interval and before the transition of the row address strobe signal fheightRAS from logic "LOW" to logic "HIGH", thus turning back on the transmission gate TG2. The pulse φCK is enabled after this ground voltage noise interval by the signal φD going to logic "LOW" after the delay in the delay circuit 600. φD going to the logic "LOW" turns off the NAND gate NG2, thus enabling φCK.

The delay circuit 600 and NAND gate NG2 in combination form an embodiment of a pulse generator, activating the pulse when the internal signal turns the NAND gate NG2 on and deactivating the pulse after the delay generated by the delay circuit 600.

As stated above, the row address strobe signal input buffer, according to the invention, can prevent the internal signal from being disabled due to the power noise. Furthermore, the row address strobe signal input buffer is not influenced by the ground voltage noise generated by the bit line sensing noise or the data output noise.

While there have been illustrated and described what are considered to be preferred embodiments of the present invention, it will be understood by those skilled in the art that various changes in form and details may be made without departing from the spirit and scope of the present invention as defined by the appended claims.

What is claimed is:

1. A row address strobe signal input buffer comprising:
   a pad for receiving a row address strobe signal;
   a level-shifting buffer connected to said pad, for receiving said row address strobe signal and generating a level-shifted internal signal, the level-shifting buffer including an output terminal;
   a pulse generator connected to said output terminal of said level-shifting buffer, for generating a pulse having a predetermined duration in response to said internal signal;
   a switching circuit connected between the output terminal of said level-shifting buffer, and said pad; and
   a latch circuit connected to said output terminal of said level-shifting buffer, for maintaining a level of said internal signal for at least the duration of said pulse.

2. A row address strobe signal input buffer according to claim 1, wherein said level-shifting buffer converts said row address strobe signal of a TTL (Transistor-Transistor Logic) level into said internal signal of a CMOS (Complementary Metal Oxide Semiconductor) level.

3. A row address strobe signal input buffer according to claim 2, wherein said level-shifting buffer comprises an odd-number inverters.

4. A row address strobe signal input buffer according to claim 1, wherein said switching circuit comprises a transmission gate for cutting off said signal path only while said pulse is activated.

5. A row address strobe signal input buffer according to claim 1, wherein said latch circuit comprises a MOS transistor having a channel connected between a power voltage terminal and said output terminal of said level-shifting buffer and having a gate connected to receive said pulse.

6. A row address strobe signal input buffer according to claim 1, said pulse generator comprising:
a delay circuit connected to said output terminal for generating a delay signal in response to said internal signal,
a NAND gate with at least two inputs, said first input connected to said output terminal and said second input connected to said delay signal of said delay circuit;
said NAND gate activating said pulse in response to said internal signal and deactivating said pulse in response to said delay signal of said delay circuit.

7. A row address strobe signal input buffer of a semiconductor memory device including a pad for receiving a row address strobe signal, said row address strobe signal input buffer comprising:

a level-shifting buffer connected to said pad, for generating a level-shifted internal signal in response to said row address strobe signal when a power-up reset signal for cutting off an operation of internal circuits constituting said semiconductor memory device until said reset signal rises up to a predetermined level is activated;
a pulse generator for generating a pulse delayed for a predetermined time in response to said internal signal;
a switching circuit connected to an output terminal of said level-shifting buffer, for cutting off a signal path between said row address strobe signal and said internal signal; and
a latch circuit connected to said output terminal of said level-shifting buffer, for maintaining a level of said internal signal for at least the duration of said pulse.

8. A row address strobe signal input buffer according to claim 7, wherein said level-shifting buffer comprises:
a NOR gate having two inputs for receiving said power-up reset signal and said row address strobe signal; and
an even-number of inverters connected to an output terminal of said NOR gate.

9. A row address strobe signal input buffer according to claim 8, wherein said level-shifting buffer converts said row address strobe signal of a TTL (Transistor-Transistor Logic) level into said internal signal of a CMOS (Complementary Metal Oxide Semiconductor) level.

10. A row address strobe signal input buffer according to claim 7, wherein said switching circuit comprises a transmission gate for cutting off said signal path only while said pulse is activated.

11. A row address strobe signal input buffer according to claim 7, wherein said latch circuit comprises a MOS transistor having a channel connected between a power voltage terminal and said output terminal of said level-shifting buffer and having a gate connected to receive said pulse.

12. A row address strobe signal input buffer according to claim 7, wherein said predetermined level is 2 volts.

13. A row address strobe signal input buffer according to claim 7, said pulse generator comprising:
a delay circuit connected to said output terminal for generating a delay signal in response to said internal signal,
a NAND gate with at three inputs, said first input connected to said output terminal, said second input connected to said delay signal of said delay circuit and said third input connected to said reset signal;
said NAND gate activating said pulse in response to said internal signal and deactivating said pulse in response to said delay signal of said delay circuit, when said reset signal is active.

14. A method for providing an internal signal responsive to an external row address strobe signal comprising the steps of:

asserting an internal signal in response to a transition of a row address strobe signal;
generating a pulse responsive to a transition of said internal signal, the pulse having a predetermined duration;
maintaining a state of said internal signal for at least the duration of said pulse; and
de-asserting said internal signal in response to a second transition of said row address strobe signal.

15. A method for providing an internal signal responsive to an external row address strobe signal according to claim 14 wherein said step of maintaining said internal signal state includes isolating said internal signal from said row address strobe signal for at least the duration of said pulse so as to prevent said internal signal from toggling due to noise.

16. A method for providing an internal signal responsive to an external row address strobe signal according to claim 15, wherein said step of asserting said internal signal includes level-shifting said row address strobe signal to said internal signal of a CMOS signal level.

17. A method for providing an internal signal responsive to an external row address strobe signal according to claim 15, wherein said step of generating a pulse comprises the steps:

beginning said pulse with a transition of said internal signal,
delaying said internal signal through a delay circuit,
ending said pulse upon completion of said delaying step.

* * * * *

UNITED STATES PATENT AND TRADEMARK OFFICE
CERTIFICATE OF CORRECTION

PATENT NO. : 5,982,704
DATED : November 9, 1999
INVENTOR(S) : Kim

It is certified that error appears in the above-identified patent and that said Letters Patent is hereby corrected as shown below:

Column 1,
Lines 16, 18, 22, 25, 58, 59, 64 and 65, "fheight $\overline{RAS}$" should read -- $\overline{RAS}$ --.
Line 42, "fheight $\overline{RAS}$ al" should read -- $\overline{RAS}$ al --.

Column 2,
Line 26, "the level-shiting buffer" -- should read -- the level-shifting buffer --.

Column 3,
Lines 25, 28, 32, 35 and 65, "fheight $\overline{RAS}$" should read -- $\overline{RAS}$ --.
Line 59, "odd-number inverters" should read -- odd number of inverters --.

Column 4,
Lines 5 and 16, "fheight $\overline{RAS}$" should read -- $\overline{RAS}$ --.

Column 6,
Line 13, "with at three" should read -- with at least three --.

Signed and Sealed this

Twenty-first Day of May, 2002

*Attest:*

*Attesting Officer*

JAMES E. ROGAN
*Director of the United States Patent and Trademark Office*